United States Patent
Hülsmann et al.

(10) Patent No.: US 6,190,209 B1
(45) Date of Patent: Feb. 20, 2001

(54) MOTOR-VEHICLE LATCH HOUSING WITH INTEGRAL CONDUCTORS

(75) Inventors: Thomas Hülsmann, Velbert; Ulrich Nass, Mülheim, both of (DE)

(73) Assignee: Kierkert AG, Heilingenhaus (DE)

( * ) Notice: Under 35 U.S.C. 154(b), the term of this patent shall be extended for 0 days.

(21) Appl. No.: 09/340,321

(22) Filed: Jun. 25, 1999

(30) Foreign Application Priority Data

Aug. 25, 1998 (DE) .............................................. 198 38 554
Apr. 15, 1999 (DE) .............................................. 199 16 949

(51) Int. Cl.[7] .................................................. H01R 33/00
(52) U.S. Cl. ........................... 439/660; 439/931; 439/74; 439/857
(58) Field of Search ..................................... 439/660, 722, 439/736, 751, 74, 78, 81, 82, 931, 873, 876, 857, 856, 34

(56) References Cited

U.S. PATENT DOCUMENTS

| | | | |
|---|---|---|---|
| 3,805,117 | * 4/1974 | Hausman | 361/743 |
| 4,736,266 | * 4/1988 | Tanibe | 439/74 |
| 4,878,862 | * 11/1989 | Wise | 439/787 |
| 4,906,209 | * 3/1990 | Tanabe et al. | 439/751 |
| 5,626,483 | * 5/1997 | Naitoh | 439/74 |
| 5,931,689 | * 8/1999 | Patel | 439/74 |
| 5,938,455 | * 8/1999 | Glovatsky et al. | 439/74 |
| 5,967,850 | * 10/1999 | Crane, Jr. | 439/660 |

\* cited by examiner

*Primary Examiner*—Paula Bradley
*Assistant Examiner*—Tho D. Ta
(74) *Attorney, Agent, or Firm*—Herbert Dubno; Andrew Wilford

(57) ABSTRACT

A motor-vehicle door latch housing has a dielectric plastic body, an electrical device secured to the body, a plurality of electrical conductors each at least partially imbedded in the body and each having an end forming a terminal adjacent the device, and a plurality of connectors on the device each is elastically deformable and bearing elastically on a respective one of the terminals. Each terminal fits in a predetermined direction with the respective connector. The connectors are deformed elastically transversely to the installation direction when fitted with the respective terminals. Thus as the device is fitted to the body, its connectors are automatically joined to the terminals.

15 Claims, 6 Drawing Sheets

MOTOR-VEHICLE LATCH HOUSING WITH INTEGRAL CONDUCTORS

FIELD OF THE INVENTION

The present invention relates to a machine housing. More particularly this invention concerns such a housing with integral conductors for built-in electrical devices of the latch.

BACKGROUND OF THE INVENTION

It is known to provide a motor-vehicle door latch or a gear box, e.g. of a vehicle's transmission, with a housing in which are integral various conductors that conduct power to and feed control signals to and from various electrical devices such as switches and motors in the latch. To this end the latch housing is typically cast of a rigid nonconducting plastic in which is integral a metal plate to which the principal mechanical elements of the latch are fixed. The conductors are thin strips, for instance of a plastic/metal laminate, that are imbedded in or laminated to the housing and that have ends functioning as terminals to which are connected wires leading away from the latch.

The wires must be attached to the terminal ends of the conductors such that a solid electrical connection is made that cannot readily be shaken loose. At the same time the connection must be made in such a manner that it does not damage the terminal or place unnecessary stress on the housing or conductors. The standard connection is made either by forming the conductors ends as sleeves suitable for soldering wires to, or as pockets with spring lips for insertion of special connectors. Both systems are somewhat laborious to connect to and/or require a tricky connection operation that slows installation of the door latch or other such part.

OBJECTS OF THE INVENTION

It is therefore an object of the present invention to provide an improved housing with integral conductors.

Another object is the provision of such an improved housing with integral conductors which overcomes the above-given disadvantages, that is which is of simple construction and where connection to the conductors is easy but places no undue stress on them.

SUMMARY OF THE INVENTION

A motor-vehicle door latch housing has according to the invention a dielectric plastic body, an electrical device secured to the body, a plurality of electrical conductors each at least partially imbedded in the body and each having an end forming a terminal adjacent the device, and a plurality of connectors on the device each elastically deformable and bearing elastically on a respective one of the terminals. Each terminal fits in a predetermined direction with the respective connector. The connectors are deformed elastically transversely to the installation direction when fitted with the respective terminals. Thus as the device is fitted to the body, its connectors are automatically joined to the terminals.

By making the connectors springy so that they bear elastically against the terminals, minor changes in position caused by thermal expansion or contraction do not lead to disconnection. This construction also simplifies manufacture of the housing in that the elements with the springy connectors can be installed near the devices they extend from, so that the deformation or spring force can be resisted by the cast body of the electrical device. The connectors are stressed during installation, but thereafter are only subjected to the modest biasing force necessary to maintain good electrical contact. Thus a sensitive microswitch or the like is not likely to be damaged on installation.

According to a further feature of the invention the connectors are formed as metallic strips and project transversely to the direction from the device. In one system each terminal projects parallel to the direction from the respective conductor and each connector has a pair of arms elastically spreadable transversely to the direction and embracing the respective terminal. Here each connector is formed between the respective arms with a notch fitted over the respective terminal. The connectors are U- or Ω-shaped.

Alternately according to the invention each terminal is formed as a pocket open in the direction. In this system each connector end is U-shaped and has a pair of sides elastically engaging the respective terminal.

The connector end can also be formed in accordance with the invention as a pair of oppositely bent elastically deformable tabs and each terminal is formed as a pocket open in the direction and receiving the respective tabs. Furthermore it is possible for the terminal to be formed as a pin projecting in the direction and for the connector to include a pair of connector parts elastically embracing the respective pin.

To augment the spring force of the connectors, respective biasing elements bear in the direction on the connectors and press same onto the respective terminals.

Each conductor in accordance with the invention is formed as a metallized plastic strip secured to the body. The metallized plastic strips are electroplated. Alternately they can be laminated with a conductive metal.

In another arrangement according to the invention the body is formed with throughgoing holes and the conductors extend through the holes between opposite faces of the body.

BRIEF DESCRIPTION OF THE DRAWING

The above and other objects, features, and advantages will become more readily apparent from the following description, it being understood that any feature described with reference to one embodiment of the invention can be used where possible with any other embodiment and that reference numerals or letters not specifically mentioned with reference to one figure but identical to those of another refer to structure that is functionally if not structurally identical. In the accompanying drawing.

SPECIFIC DESCRIPTION

Figure 1:
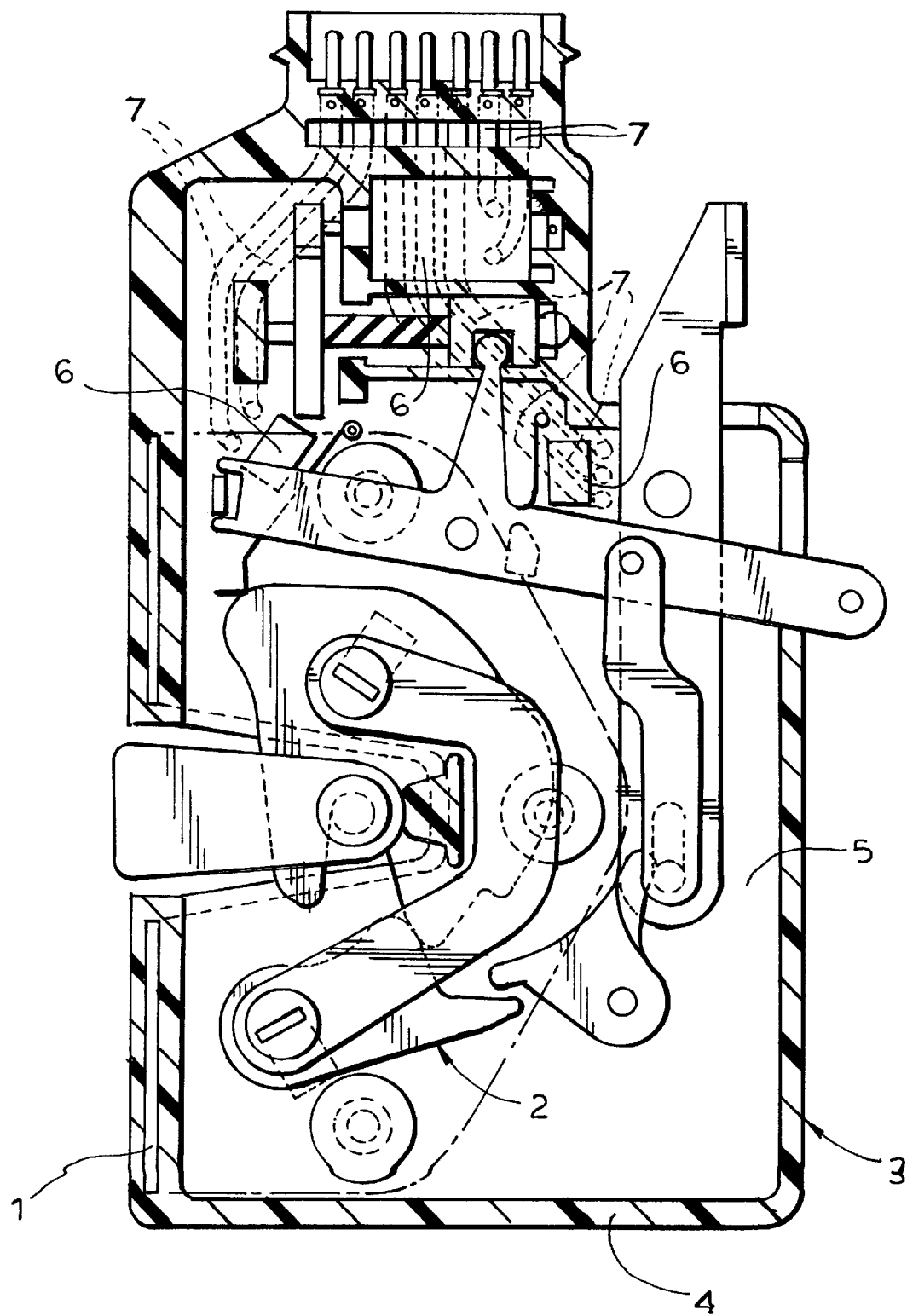
FIG. 1 is a sectional view through a motor-vehicle door latch according to the invention.

As seen in FIG. 1 a door-latch housing according to the invention has a metal mounting plate 1 carrying various mechanical door-latch parts 2 and imbedded in a plastic housing 3 having a wall 4 defining a space 5 for the parts 2 and for various electrical devices 6, here microswitches and a motor that coact with the parts 2. Conductors 7 imbedded in the plastic housing 3 serve to conduct electricity to and away from the parts 6.

Figure 2:
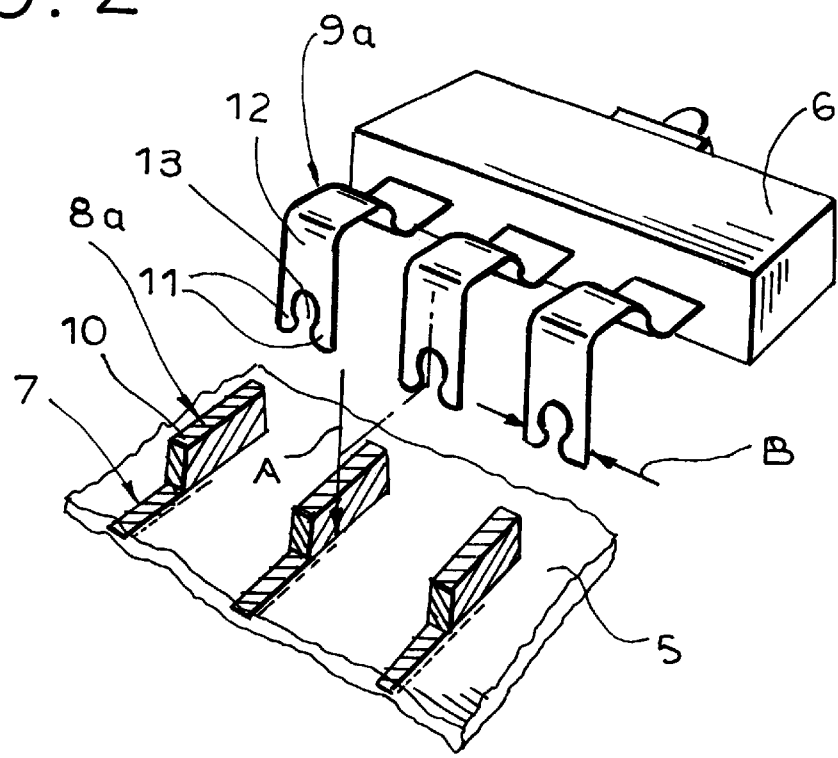
FIGS. 2 and 3 are perspective views of connector assemblies of the latch.

As shown in FIG. 2 the conductors 7 terminate at terminals 8a formed here as small blocks 10 that are engaged by connectors 9a on the part 6. The connectors 9a are formed as springy metallic strips having ends 12 each formed with a U- or Ω-shaped cutout 13 defined between sides or arms 11 that are dimensioned to fit over and tightly embrace the respective blocks 10. The connectors 9a are fitted to the terminals 8a in a direction A that is transverse to the direction B in which the connectors 9a are deformed elastically so as to ensure a good hold while minimizing stress to the parts.

Figure 3:
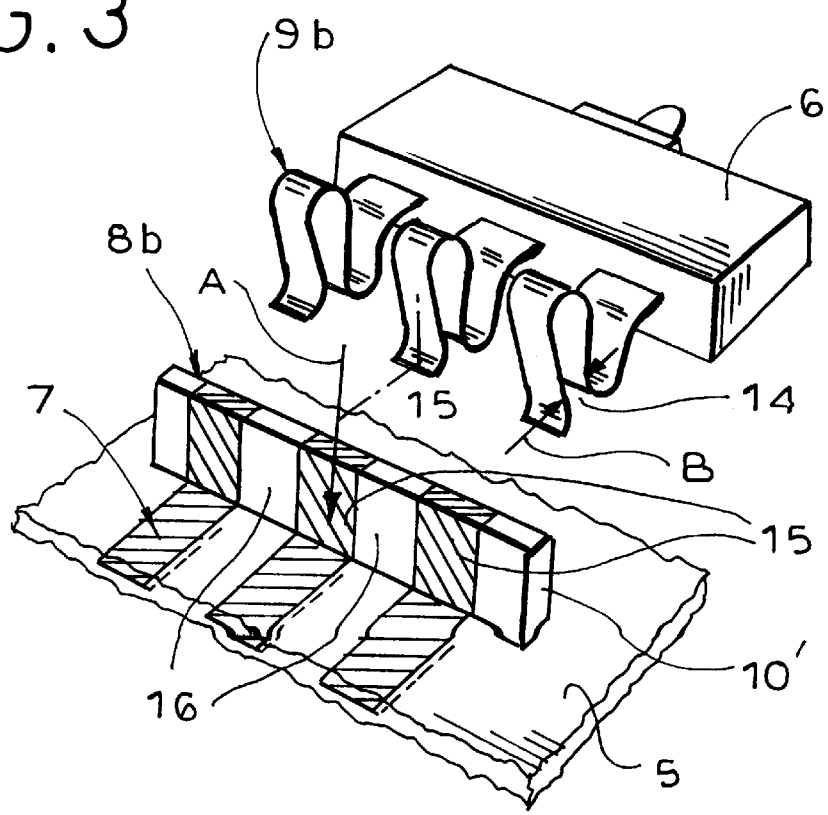

In FIG. 3 the conductors 7 have ends 15 that run up and over a nonconductive strip 10' to form individual terminals 8b that are engaged between arms 14 of metallic strip connectors 9b. Portions 16 of the insulating bar 10' between the terminals 8b insulate them from each other. These connectors 9b are basically S-shaped to be quite springy, and to grip in the direction B transverse to the direction A in which they are moved to engage over the terminals 8b.

Figure 4:
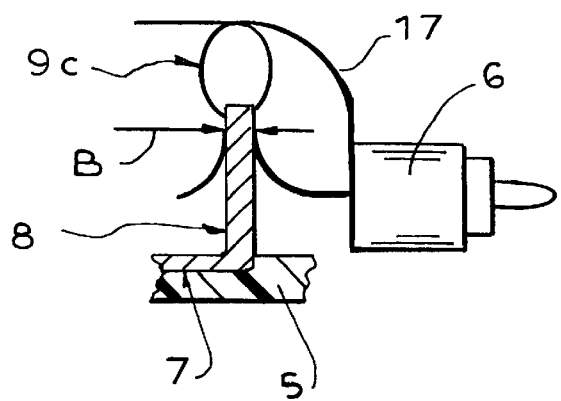
FIG. 4 is a cross section through a variation on the system of FIG. 3.

FIG. 4 shows a variant on the FIG. 3 system where a U-shaped connector 9c is biased downward by a reinforcing arm 17 attached to the part 6. Here the terminal 8c is formed by a thick upwardly bent end of the conductor 7.

Figure 5:
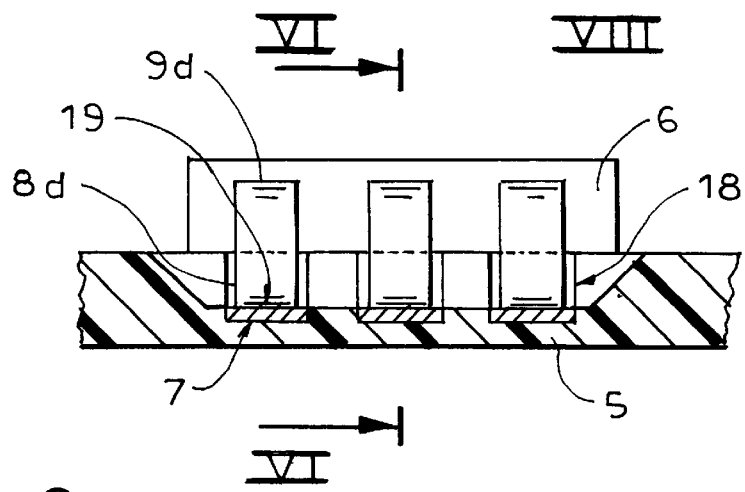
FIG. 5 is a section through another connector system in accordance with the invention.
Figure 6:
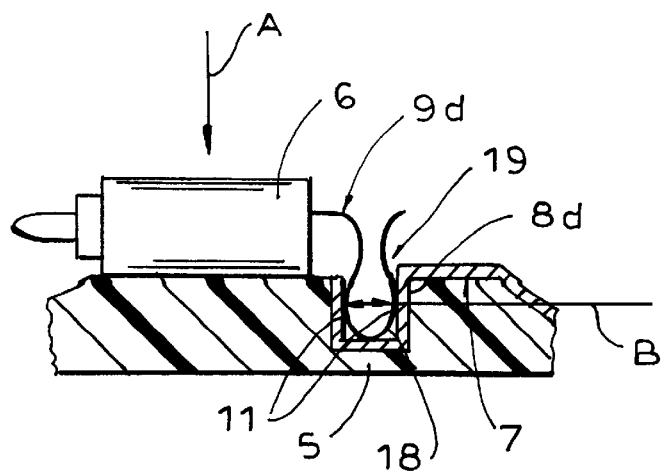
FIG. 6 is a section taken along line VI—VI of FIG. 5.
Figure 7:
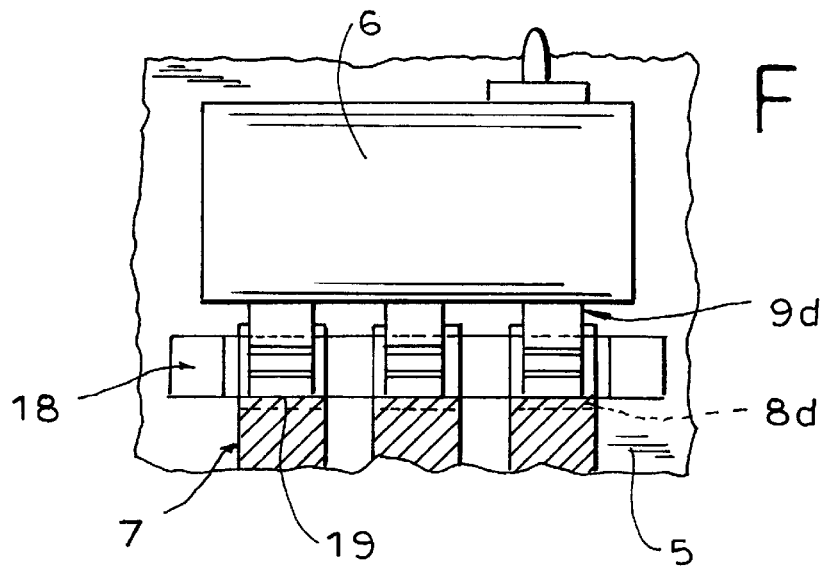
FIG. 7 is a top view taken in the direction of arrow VII of FIG. 5.

In FIGS. 5, 6, and 7 generally U-shaped connectors 9d are fitted in pockets 18 forming terminals 8d into which ends of the conductors 7 have been fitted as liners 19. Thus sides 11 of the loops formed by the connectors 9d bear elastically against the conductor ends 19 to form a good electrical connection.

Figure 8:
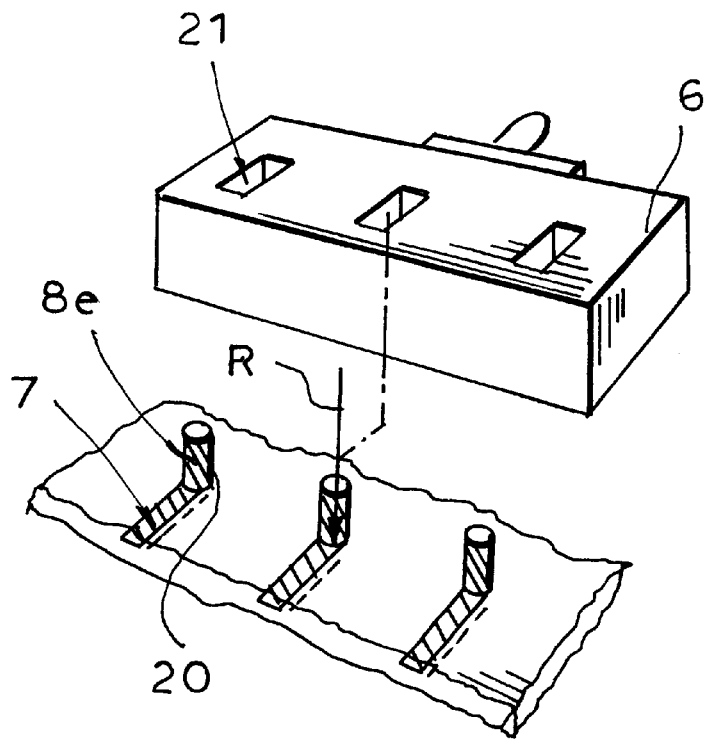
FIG. 8 is a perspective view of another connector assembly according to the invention, in separated condition.
Figure 9:
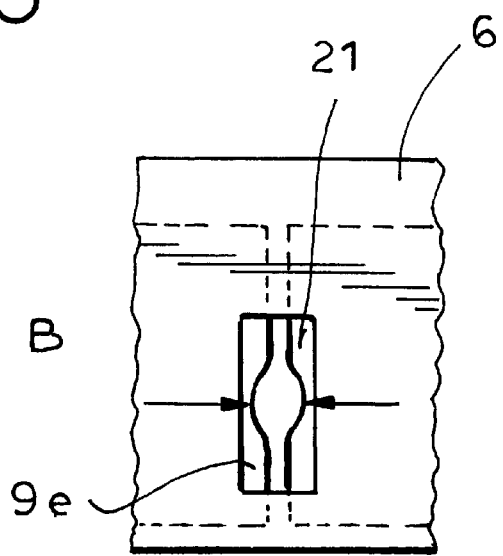
FIG. 9 is a top view of the assembly of FIG. 8, in joined condition.

In FIGS. 8 and 9 the conductors 7 are fitted at their ends with upstanding cylindrical pins 20 forming terminals 8e intended to fit into holes 21 in the part 6 where outwardly deflectable portions 9e of the connectors are exposed. When the part 6 is fitted down over the pins 20 they engage with the connectors 9e to form a good electrical connection.

Figure 10A:
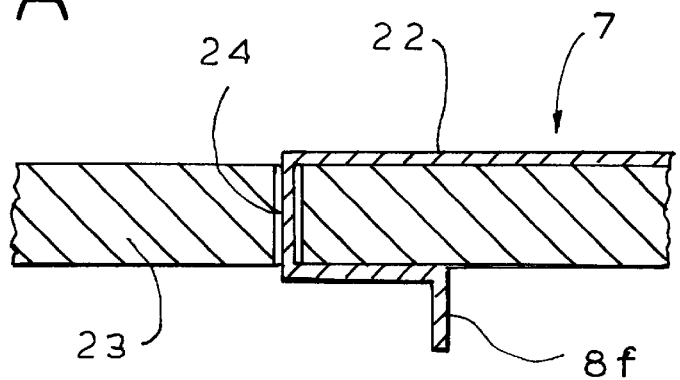
FIGS. 10A and 10B are large-scale sections showing further variants on the invention.
Figure 10B:
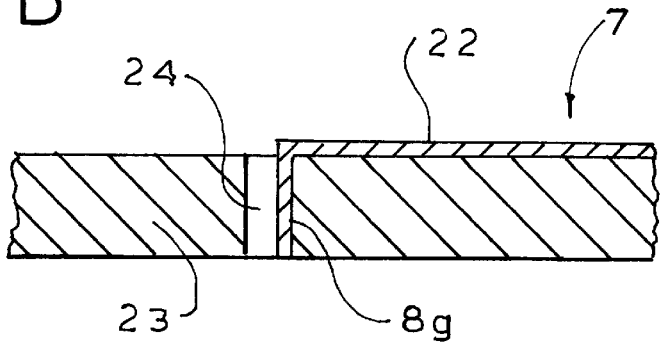

FIGS. 10A and 10B show how an end 22 of a conductor 7 can be extended through a hole 24 in a portion 23 of the plastic housing 3 to either form on its opposite face a terminal 8f projecting from the portion 23, or can simply line one side of the hole 24 to form therein a terminal 8g that can couple with a connector inserted into the hole 24.

Figure 11:
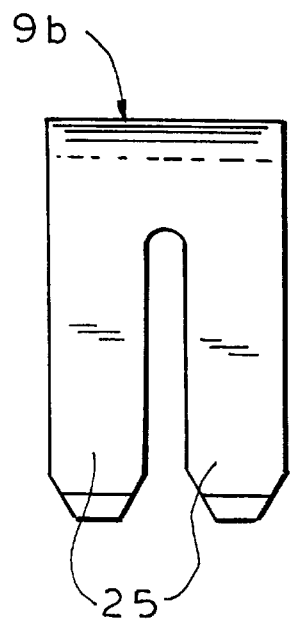
FIGS. 11 and 12 are front and side perspective views of another connector in accordance with the invention.
Figure 12:
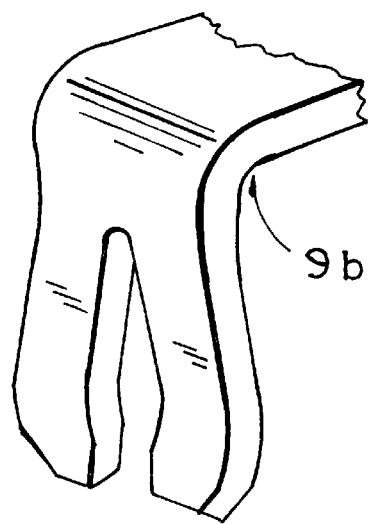
Figure 13:
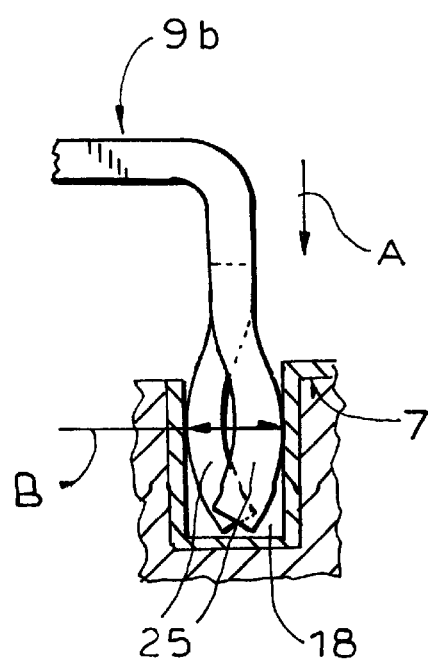
FIG. 13 is a section showing use of the connector of FIGS. 11 and 12.

The connector 9h of FIGS. 11 to 13 has a bifurcated or forked end forming a pair of oppositely bent tabs 25 that are adapted to engage opposite sides of a lined pocket 18 constructed as in FIGS. 5 and 6. Once again, the connector 9h is adapted to be inserted in a direction A into the pocket 18 and its tabs 25 are deformed elastically in the perpendicular direction B.

We claim:

1. A motor-vehicle door latch housing comprising:
    a dielectric plastic body;
    a metal mounting plate imbedded in the body;
    latch parts mounted on the plate;
    an electrical device secured to the body;
    a plurality of electrical conductors each at least partially imbedded in the body, and each having an end forming a terminal adjacent the device;
    a plurality of elastically deformable connectors projecting transversely to a predetermined insertion direction from the device and each formed as a metallic strip bearing elastically on a respective one of the terminals; and
    respective biasing elements projecting from the electrical device bearing in the insertion direction on the connectors and pressing same in the insertion direction onto the respective terminals.

2. The motor-vehicle door latch housing defined in claim 1 wherein the body is formed with throughgoing holes and the conductors extend through the holes between opposite faces of the body.

3. The motor-vehicle door latch housing defined in claim 1 wherein the connectors are generally L-shaped and each have an inner part extending generally perpendicular to the insertion direction and an outer part extending generally parallel to the insertion direction.

4. The motor-vehicle door latch housing defined in claim 1 wherein each terminal fits in the predetermined insertion direction with the respective connector, the connectors being deformed elastically transversely to the insertion direction when fitted with the respective terminals.

5. The motor-vehicle door latch housing defined in claim 4 wherein each terminal is formed as a pocket open in the insertion direction.

6. The motor-vehicle door latch housing defined in claim 4 wherein each connector is U-shaped and has a pair of sides elastically engaging the respective terminal.

7. The motor-vehicle door latch housing defined in claim 4 wherein the connectors are each formed as a pair of oppositely bent elastically deformable tabs and each terminal is formed as a pocket open in the insertion direction and receiving the respective tabs.

8. The motor-vehicle door latch housing defined in claim 4 wherein each terminal is formed as a pin projecting in the insertion direction and the connector includes a pair of connector parts elastically embracing the respective pin.

9. The motor-vehicle door latch housing defined in claim 4 wherein each terminal projects parallel to the insertion direction from the respective conductor, each connector having a pair of arms elastically spreadable transversely to the insertion direction and embracing the respective terminal.

10. The motor-vehicle door latch housing defined in claim 9 wherein each connector is U- or Ω-shaped and formed with a notch open in the insertion direction.

11. The motor-vehicle door latch housing defined in claim 9 wherein each connector is formed between the respective arms with a notch fitted over the respective terminal.

12. The motor-vehicle door latch housing defined in claim 11 wherein the connectors are U- or Ω-shaped.

13. The motor-vehicle door latch housing defined in claim 1 wherein each conductor is formed as a metallized plastic strip secured to the body.

14. The motor-vehicle door latch housing defined in claim 13 wherein the metallized plastic strips are electroplated.

15. The motor-vehicle door latch housing defined in claim 13 wherein the metallized plastic strips are laminated with a conductive metal.

* * * * *